(12) United States Patent   (10) Patent No.: US 8,174,268 B2
Bose et al.   (45) Date of Patent: May 8, 2012

(54) PROTECTIVE RELAY MONITORING SYSTEM AND METHOD OF COMPARING BEHAVIOR PATTERNS

(75) Inventors: Sanjay Bose, West Edison, NJ (US); Anthony T. Giuliante, Galloway, NJ (US); Amir Makki, Northfield, NJ (US)

(73) Assignees: Consolidated Edison Company of New York, Inc., New York, NY (US); Softstuf, Inc., Philadelphia, PA (US)

( * ) Notice: Subject to any disclaimer, the term of this patent is extended or adjusted under 35 U.S.C. 154(b) by 480 days.

(21) Appl. No.: 12/505,947

(22) Filed: Jul. 20, 2009

(65) Prior Publication Data

US 2011/0012603 A1   Jan. 20, 2011

(51) Int. Cl.
*G01R 31/02* (2006.01)
*G01R 15/00* (2006.01)
*H02H 3/00* (2006.01)

(52) U.S. Cl. ............. 324/418; 324/424; 361/66; 702/57
(58) Field of Classification Search .......... 324/415–424, 324/539–544; 702/57; 361/66, 80
See application file for complete search history.

(56) References Cited

U.S. PATENT DOCUMENTS

| | | | |
|---|---|---|---|
| 4,218,718 A | | 8/1980 | Sun |
| 4,470,091 A | | 9/1984 | Sun et al. |
| 5,367,426 A | * | 11/1994 | Schweitzer, III ............... 361/80 |
| 7,180,297 B2 | | 2/2007 | Deak et al. |
| 7,369,950 B2 | | 5/2008 | Wall et al. |
| 7,409,303 B2 | | 8/2008 | Yeo et al. |
| 2009/0187344 A1 | | 7/2009 | Brancaccio et al. |
| 2009/0216573 A1 | | 8/2009 | Heiberg-Andersen et al. |

OTHER PUBLICATIONS

International Search Report mailed Feb. 22, 2011 for Application No. PCT/US2010/042500.
Written Opinion of the Internation Searching Authority mailed Feb. 22, 2011 for Application No. PCT/US2010/042500.
S. Bhatt "The Application of Power Quality Monitoring Data for Reliability Centered Maintenance" EPRI (2000) 152 pages; Electric Power Research Institute, Inc.

* cited by examiner

*Primary Examiner* — Melissa Koval
*Assistant Examiner* — Farhana Hoque
(74) *Attorney, Agent, or Firm* — Cantor Colburn LLP

(57) ABSTRACT

A system for collecting data and monitoring the operation of electrical circuits, such as branch circuits at a substation is provided. The system collects data from a plurality of sensors coupled to a plurality of electrical equipment associated with a circuit. The data from the sensors is collected and used to identify signatures in the data to ascertain potential issues in the electrical protective circuit. The data is further analyzed to determine signatures of abnormal operating conditions. The signatures are compared to reference signatures to identify the abnormal conditions and corrective action is initiated.

10 Claims, 12 Drawing Sheets

FIG. 3
PRIOR ART

Events/Sensors Activity Log:

| | State | Trigger-Time | Description |
|---|---|---|---|
| * | A | 04/23/2009 17:10:56.655000 | 1-85-1/F42:ABC:D-IT |
| * | A | 04/23/2009 17:10:56.661838 | 1-85-1/F42:ABC:D-IT |
| N | A | 04/23/2009 17:10:56.663120 | 4-86-1/F42:BKR6W:D-IT |
|   | A | 04/23/2009 17:10:56.663120 | 5-86-1/F42:BKR7W:D-IT |
|   | A | 04/23/2009 17:10:56.665684 | 6-86TT-1/F42:BKR6W:D-IT |
| N |   | 04/23/2009 17:10:56.682778 | 6-86TT-1/F42:BKR6W:D-IT |
| N |   | 04/23/2009 17:10:56.685770 | 5-86-1/F42:BKR7W:D-IT |
| N |   | 04/23/2009 17:10:56.692607 | 4-86-1/F42:BKR6W:D-IT |

PROTECTIVE RELAY MONITORING SYSTEM AND METHOD OF COMPARING BEHAVIOR PATTERNS

BACKGROUND OF THE INVENTION

The present invention relates generally to electrical power transmission and distribution networks and more particularly to a system for monitoring electrical characteristics of protective relay systems and determining abnormal operating conditions.

Electrical power is typically produced at centralized power production facilities and transferred at high voltages to local substations. The local substations transform the electrical power to a medium or low voltage. The electrical power is subsequently distributed through feeders to local distribution networks.

Electrical utilities have a number of metrics that are used to track performance and customer satisfaction. These metrics, which include the system average interruption frequency index ("SAIFI"), the customer average interruption duration index ("CAIDI"), and for some utilities, the momentary average interruption frequency index ("MAIFI"). SAIFI measures the average number of interruptions that a customer would experience during a time period, such as a year. CAIDI measures the duration of the interruption that a customer would experience, and is generally a few hours per year. MAIFI measures the number of power interruptions that have a duration of less than five minutes that a customer would experience during a given time period. Some or all of these metrics are also used by government regulators to aid in determining if the electrical utility is adhering to the regulations in maintaining a durable and reliable electrical service.

Thus, it is desirable for the utilities to monitor the health and performance of their electrical network to ensure customer satisfaction and compliance with governmental regulations. Advanced electrical networks, sometimes referred to as "Smart Grid" apply advanced sensors and two-way communications technologies to keep track of the network operations from the generation plant to the electrical outlets in a customers residence. When fully implemented, the Smart Grid will allow for generators, distribution equipment and loads to interact in real time. Electrical demand or variances in electrical characteristics may then be actively managed, reducing wear on equipment and improving reliability.

The ability of these advanced sensors to monitor and record electrical characteristics provides the electrical utilities with a large amount of information, including but not limited to voltage, current, real power, and reactive power for example. When the sensor network is expanded to monitoring many electrical circuits, the large volume of information becomes difficult for electrical utility personnel to utilize. This problem increases in complexity as the sampling rate of the sensor network becomes larger.

One of the impediments to the implementation of Smart Grid is the existence of legacy systems and equipment, such as electromechanical relays for example. This equipment is in widespread use making replacement costly and time consuming. One further difficulty is that this equipment is often difficult to retrofit with modern communications capability. As a result, when protective equipment, such as a protective relay for example, is activated, utility personnel must travel to the location and manually inspect the equipment. Often the only indication will be a mechanical visual indicator, sometimes referred to as a "target flag." Where monitoring equipment is available for protective relays, the data provided only provides limited insight to utility personnel.

Thus, while existing electrical network monitoring systems are suitable for their intended purpose, there remains a need for improvements. In particular, there remains a need for improvement regarding the ability to monitor and analyze information collected from sensors coupled to protective relay systems to detect and identify abnormal operating conditions.

SUMMARY OF THE INVENTION

In one embodiment of the invention, a method of monitoring a protective relay system is provided. The method includes the step of sensing a first signal current flowing from a protective relay. The first signal current is stored. A first signature portion of the first signal current is identified. The first signature portion is compared against a reference signature. An undesired operating condition is identified from the first signature portion.

In accordance with another embodiment of the invention, a protective relay system coupled to an electrical distribution device is provided. The protective relay system includes at least one protective relay coupled to communicate a first signal to the electrical distribution device in response to a first event. A sensor is coupled to the at least one protective relay to sense the first signal, the sensor transmitting a second signal indicative of the first signal current in response to sensing the first signal. A controller is electrically coupled to the sensor to receive the second signal. The controller has a processor responsive to executable computer instructions when executed on the processor for comparing the second signal to a database of reference signals and initiating a first alarm when the second signal substantially matches a signature in the database of reference signals.

BRIEF DESCRIPTION OF THE DRAWINGS

Referring now to the drawings, which are meant to be exemplary and not limiting, and wherein like elements are numbered alike:

FIG. 3 is a prior art event and activity log produced by recording equipment that monitor the protective relays of FIG. 2;

DETAILED DESCRIPTION

Figure 1:
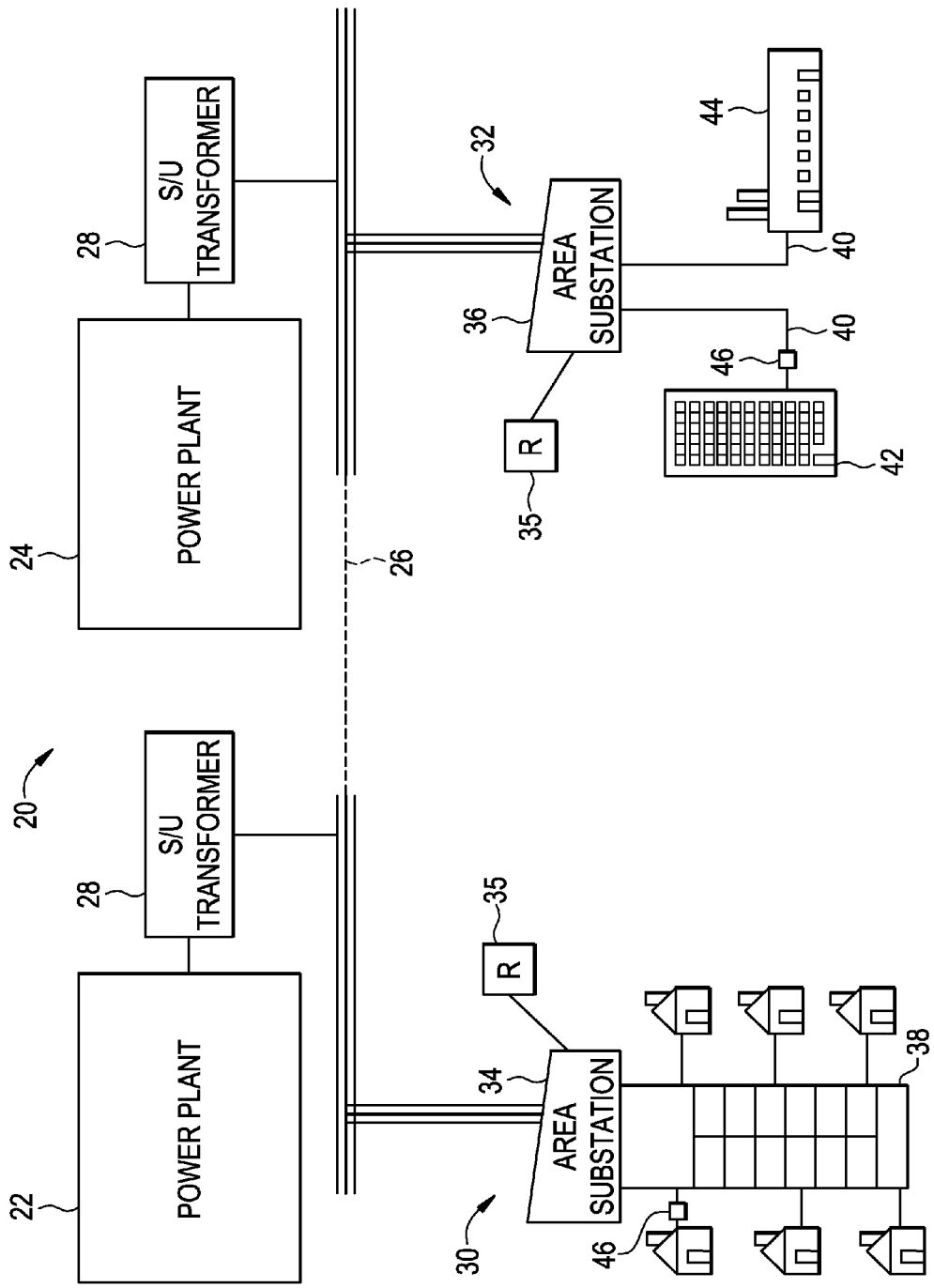
FIG. 1 is a schematic illustration of a utility electrical transmission and distribution system.

FIG. 1 illustrates an exemplary embodiment of a utility electrical transmission and distribution system 20. The utility system 20 includes one or more power plants 22, 24 connected in parallel to a main transmission system 26 by multiple step-up transformers 28. The power plants 22, 24 may include, but are not limited to: coal, nuclear, natural gas, or incineration power plants. Additionally, the power plants 22, 24 may include one or more hydroelectric, solar, or wind turbine power plants. The step-up transformers 28 increase the voltage from that produced by the power plants 22, 24 to a high voltage, such as 138 kV for example, to allow long distance transmission of the electric power over main transmission system 26. It should be appreciated that additional components such as transformers, switchgear, fuses and the like (not shown) may be incorporated into the transmission and distribution system 20 as needed to ensure the safe and efficient operation of the system. The transmission and distribution system 20 is typically organized by geographic region and controlled by either an Independent System Operator (ISO) or a Regional Transmission Organization (RTO). Each ISO/RTO networks is typically interconnected with one or more other utility networks to allow the transfer of electrical power into or out of the transmission and distribution system 20.

The main transmission system 26 typically consists of high voltage transmission power lines, anywhere from 69 KV to 500 KV for example, and associated transmission and distribution equipment which carry the electrical power from the point of production at the power plant 22 to the end users located on local electrical distribution systems 30, 32. The local distribution systems 30, 32 are connected to the main distribution system by area substations 34, 36 that are connected to the first distribution system 30 and second distribution system 32 respectively. The area substations 34, 36 reduce the transmission voltage to distribution levels such as 13 KV, 27 KV or 33 KV for the end users. Area substations 34, 36 typically contain three or more transformers, switching, protection and control equipment as well as circuit breakers to interrupt faults such as short circuits or over-load currents that may occur. Coupled to the circuit breakers is a protective relay system 35. As will be discussed in more detail below, the protective relay system 35 monitors the current, voltage, frequency, or any other type of electric power measurement either from a generating source or to a load for the purpose of triggering a circuit breaker to open in the event of an abnormal condition. There are many types of protective relays, some with highly specialized functions. Not all monitor voltage or current, either. They all, however, share the common feature of outputting a contact closure signal which can be used to switch power to a breaker trip coil, close coil, or operator alarm panel. Substations 34, 36 may also include equipment such as but not limited to fuses, surge protection, controls, meters, capacitors, load tap changers and voltage regulators for example.

It should be appreciated that the substations 34, 36 may both be connected to a single power plant, such as first power plant 22 for example. Alternatively, they may be connected to the main transmission system 26 such that the substations 34, 36 receive electrical power from different power stations, such as substation 34 receives electrical power from first power plant 22 and substation 36 receives electrical power from second power plant 24 as illustrated in FIG. 1 for example.

The area substations 34, 36 connect to one or two local electrical distribution networks 38, 40 respectively. These local networks 38, 40 provide electrical power to an area, such as a residential area or commercial zone for example. The local networks 38, 40 also include additional equipment, such as transformers 46 that adapt the voltage from that output by the substations 34, 36 to that usable by the end customers. For example, the substation 34 may distribute electrical power at 13 kV. The transformer 46 lowers the voltage to 120V/208V, which is usable by a residence. The local networks 40 may be a commercially zoned area having an office building 42 or a manufacturing facility 44 for example.

It should be appreciated that the utility network 20 may also include additional segments or portions of the network between the main transmission system 26 and the local networks 38, 40. These additional networks or segments may include additional substations that adapt or control the flow of the electrical power.

Figure 2:
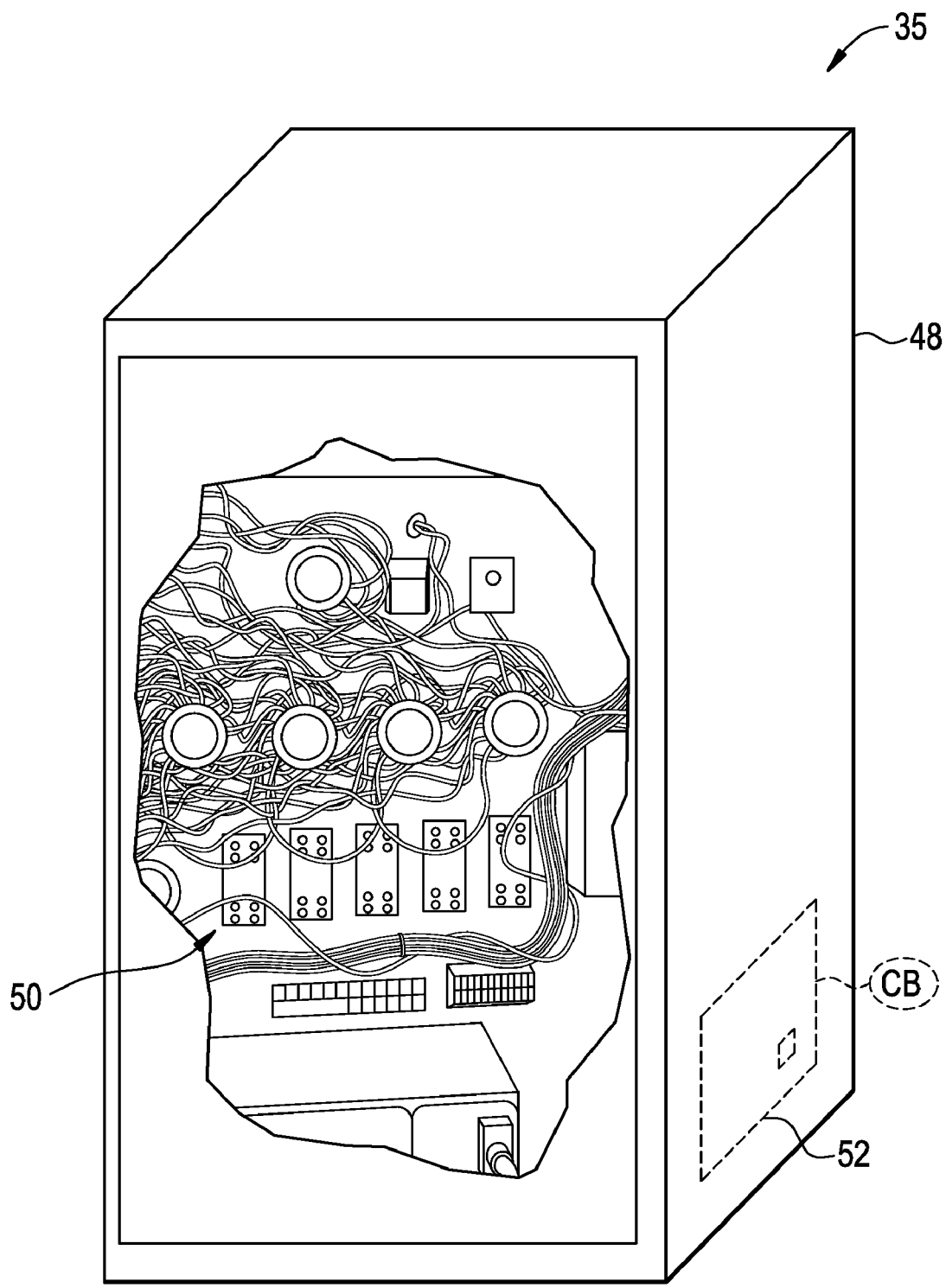
FIG. 2 is an illustration, partially in section, of a protective relay cabinet.

Referring now to FIG. 2, a typical protective relay system 35 is shown. The protective relay system 35 may include one or more cabinets 48 that house a plurality of protective relay devices 50. Each of the protective relay devices 50 is coupled to a lockout relay 52, which is connected to actuate a circuit breaker 54. The protective relay devices 50 each measure a different electrical characteristic of the electrical power flowing through the circuit breaker 54. Each protective relay device 50 is electrically connected to the power conductors of the feeder circuit and to the lockout relay 52. As a result, a large number of wires 56 are contained within the cabinet 48. It should be appreciated that due to the large number of wires, and the confined space within the cabinet 48, it is difficult to troubleshoot issues in the protection scheme. It should further be appreciated that due to the close proximity of the wires 56 connecting the protective relay devices 50 to the lockout relay 52, a potential exists for faults or issues with one wire to effect the operation of signals on other wires 56.

Figure 4:
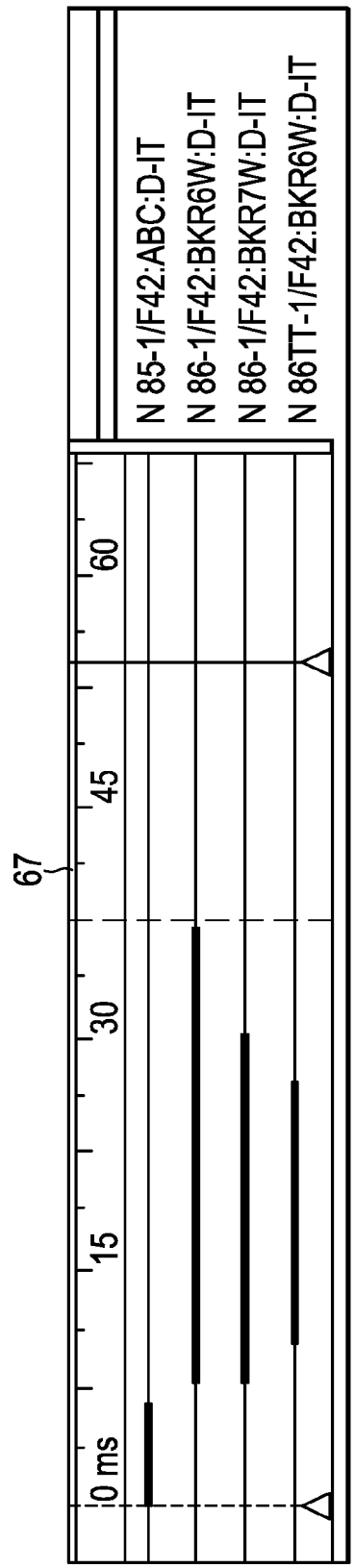
FIG. 4 is a prior art COMTRADE time chart produced by recording equipment that monitor the protective relays of FIG. 2.

When a fault occurs that is detected by one or more of the protective relay devices 50, the utility dispatches personnel to determine which protective relay or relays were activated. Where older electromechanical protective relays are installed, the utility personnel visually inspect the protective relays and look for mechanical indicator flags that are displayed by the activated protective relay. Where newer digital relays are used, in addition to a visual indicator, the digital protective relay may store data regarding events that activate the protective relay. The reports provided by a digital relay are illustrated in FIG. 3 and FIG. 4.

The event activity log 58 provides a textual report listing the state 60 of the protective relay, the time of the activity 62 and a description 64. While the textual event activity log 58 provides useful information it can be difficult to read when multiple events occur over a short period of time. To further assist utility personnel, a time chart 67, sometimes referred to as a "digital channel display" is provided as defined by IEEE standard C37.111 (COMTRADE). The time chart 67 allows the utility personnel to quickly see the relationships between different events as a function of time. While the event activity log 58 and the time chart 67 provide data that allows utility personnel to determine what issues occurred on the electrical network, these reports do not provide sufficient data to allow an assessment of the protective relay system 35. It should be appreciated that if one or more wires 56 develop an undesirable condition, such as a break in the insulation that results in arcing or there is a short between the wires 56 allowing for current leakage for example, then the protection scheme may not operate as desired causing delays in the tripping of the circuit breaker 54. These delays may over time result in damage to equipment.

Figure 5:
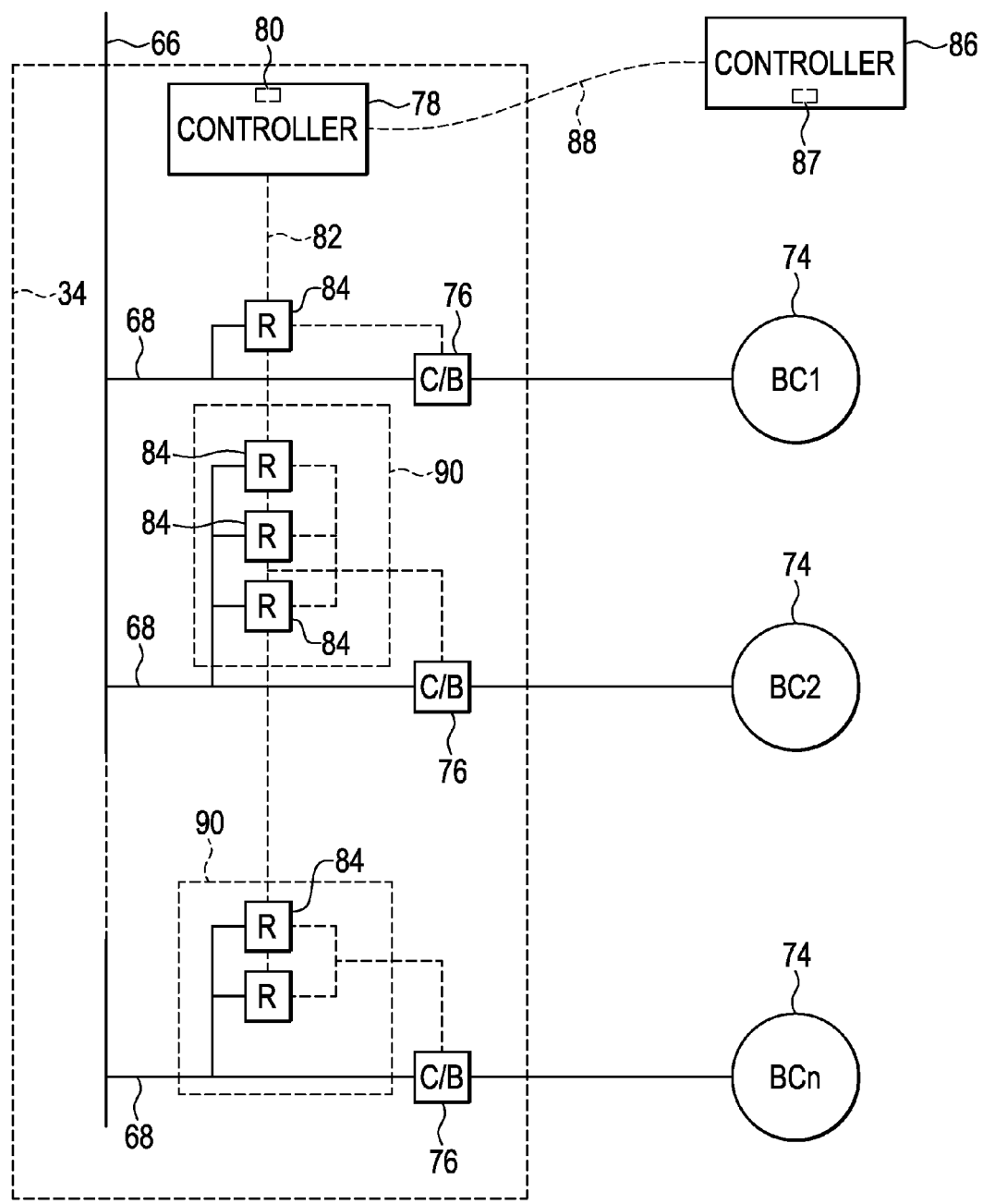
FIG. 5 is a block diagram illustration of a protective relay cabinet.

Referring now to FIG. 5, an exemplary substation system 34 will be described. The substation 34 receives electrical power from the main transmission network 26 via connection 66. The connection 66 is part of a plurality of feeders 68 within the substation 34. A feeder is a device that allows the utility to receive the incoming electrical power and subdivide the electrical power into discrete branch circuits 70, 72, 74 connected to the substation 34. Usually, each feeder 68 includes a circuit breaker 76 that allows the connection and disconnection of the substation 34 from the local network 38, 40. It should be appreciated that substation 34 and feeders 68 may include additional equipment (not shown) such as but not limited to switches, transformers, fuses, capacitors and voltage regulators for example. It should further be appreciated that a substation may have any number of feeder circuits and that these circuits are discussed herein for illustration purposes.

In the exemplary embodiment, the substation 34 also includes a controller 78. The controller 78 may be any suitable device capable of receiving multiple inputs and providing control functionality to multiple devices based on the inputs. Controller 78 includes a processor 80 that is a suitable electronic device capable of accepting data and instructions, executing the instructions to process the data, and presenting the results. The processor 80 may accept instructions through a user interface, or through other means such as but not limited to electronic data card, voice activation means, manually operable selection and control means, radiated wavelength and electronic or electrical transfer. Therefore, the processor 80 can be a microprocessor, microcomputer, a minicomputer, an optical computer, a board computer, a complex instruction set computer, an ASIC (application specific integrated circuit), a reduced instruction set computer, an analog computer, a digital computer, a molecular computer, a quantum computer, a cellular computer, a superconducting computer, a supercomputer, a solid-state computer, a single-board computer, a buffered computer, a computer network, a desktop computer, a laptop computer, or a hybrid of any of the foregoing.

The controller 60 is coupled to communicate with external devices via communications medium 82. These devices include protective relays 84 and circuit breakers 76 for example. Controller 78 may also communicate with external devices, such as a controller 86 associated with a central control facility via a communications medium 88. Similar to controller 78, controller 86 includes a processor 87 that is a suitable electronic device capable of accepting data and instructions, executing the instructions to process the data, and presenting the results. It should be appreciated that the communications mediums 82, 88 may be any suitable communications means, including wired or wireless, capable of quickly and reliably transmitting information. The communications mediums 82, 88 may also be radio connection in the 900 MHz spectrum, a leased telecommunications line (e.g. X.25, T1), a fiber network, a PSTN POTS network, a DSL telecommunications line, a cable telecommunications line, a microwave connection, a cellular connection, or a wireless connection using the IEEE 802.1 standard.

It should be appreciated that while the exemplary embodiment illustrates the controllers 78, 86 as discrete components, these devices may also be integrated into a single device that provides control functionality over both substations 34 and a central control facility. Further, the functionality of the controllers 78, 86 that are described herein may be distributed among several controllers that provide the control functionality.

It should be appreciated that the second substation 36 is arranged similarly to the first substation 34.

As discussed above, the substation 34 includes a number of different types of equipment, such as protective relays 84 and circuit breakers 76 for example, that provide the functionality needed to divide the incoming electrical power into the branch circuits 70, 72, 74. Even within these general categories, there may be different types or versions of the equipment. In the case of the protective relays 84, they may be an overcurrent, directional ground fault, or time-instantaneous type of protective relay for example. In some instances, multiple protective relays may be coupled to a branch circuit, such as the branch circuits 72, 74 for example. This allows the utility to design its protection scheme to address issues that may occur. Similar to the protective relays, different types of circuit breakers 76 may be installed, such as a switchgear or an autorecloser type circuit breaker for example.

Figure 6:
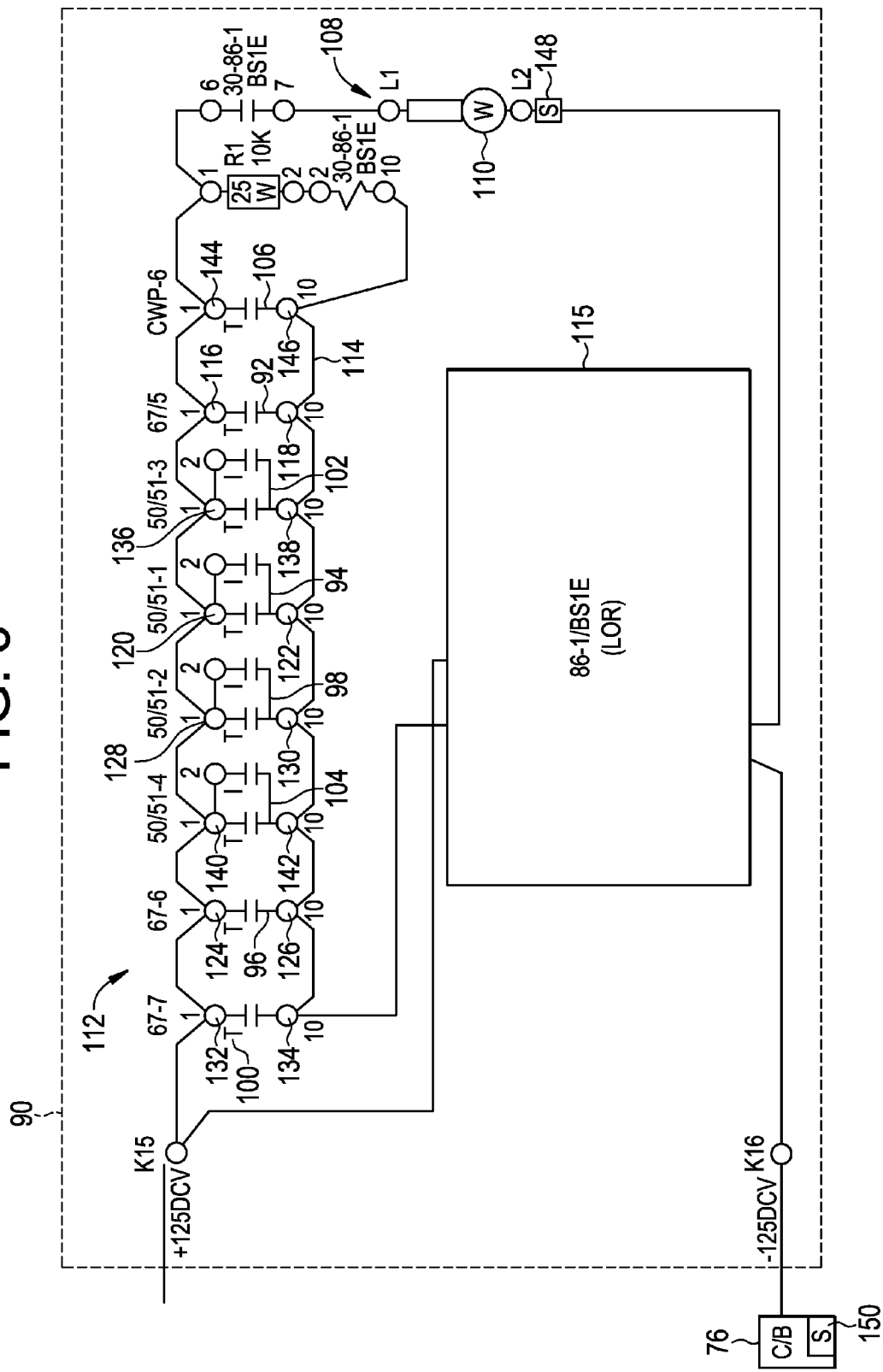
FIG. 6 is a schematic diagram illustration of a protective relay arrangement.

As discussed above, the protective relays 84 are typically housed in a protective relay panel 90. In a major substation, there may be as many as 100 protective relay panels. The panel 90 provides a housing for protecting relays 84 from the environment and for controlling the routing of the many cables needed to connect the relays 84 to a branch circuit. In the embodiment illustrated in FIG. 6, the panel 90 includes three different types of protective relays, an overload relay, a time-instantaneous relay and a directional ground fault relay. In the exemplary embodiment, the branch circuit 72 is a three-phase circuit; therefore, each phase of the branch circuit 72 has multiple protective relays. For example the protective scheme for Phase A includes an overload relay 92, and a time-instantaneous relay 94. The protective scheme for Phase B includes an overload relay 96 and a time instantaneous relay 98, while Phase C includes overload relay 100 and time instantaneous relay 102. Finally, a time-instantaneous relay 104 and a potential polarized directional ground fault relay 106 are coupled to the neutral conduit. As discussed above, each of the protective relays 84 includes an individual conduit that connects the relay to the respective phase of the branch circuit. As a result, the panel 90 is often crowded with a multitude of cables. In the event a break occurs in the power conduits, an indicator circuit 108 having a light or lamp 110 is coupled to the relay circuit. The indicator lamp 110 provides utility personnel with a visual indication as to the status of the electrical power connections within the panel 90.

Each of the protective relays 84 includes two connections. A load side connection 112 couples each relay 84 to a secondary side of a current transformer (not shown) that is electrically coupled to the branch circuit. A current transformer is a device that includes a primary winding that is placed around the branch circuit conductor. The primary winding induces a current in a secondary winding that is proportional to the current flowing through the branch circuit conductor. Since the current in the secondary winding is lower than the actual circuit conductor, measurement devices such as relays 84 may be coupled to the secondary winding without risking damage to the measurement device.

The protective relay 84 has a second connection to a trip bus, or trip ladder 114. The trip bus 114 connects each of the relays 64 in series to a lockout relay (LOR) 115. A LOR 115 is a relay that is connected to circuit breaker 76 that in response to receiving a signal from the trip bus 114, the LOR 115 transmits a signal to circuit breaker 76 causing it to trip and interrupt the flow of current.

In the exemplary embodiment, the relays 84 are coupled to a circuit breaker 76 and provide a tripping signal that causes the circuit breaker 76 to open and interrupt electrical power. It should be appreciated that if the signal from a relay 84 to the circuit breaker 76 deteriorates, or becomes corrupted, the response of the circuit breaker 76 may be delayed or impaired.

In the exemplary embodiment, remote monitoring capability is provided to the electromechanical relays 46 by clamp-on sensors coupled to connections 112, 114 at each relay 84. The sensors may be hall effect sensors, such as those further described in co-pending U.S. patent application Ser. No. 12/249,547, filed on Oct. 10, 2008, the full disclosure of which is incorporated herein by reference. Thus a pair of sensors is associated with each relay 46, one on the load side 112, and one on the trip bus side 114. As such, overload relay 92 has a load sensor 116 and a trip sensor 118; time-instantaneous relay 94 has a load sensor 120 and a trip sensor 122; overload relay 96 has a load sensor 124 and a trip sensor 126; time-instantaneous relay 98 has a load sensor 128 and a trip sensor 130; overload relay 90 has a load sensor 132 and a trip sensor 134; time-instantaneous relay 92 has a load sensor 136 and a trip sensor 138; time-instantaneous relay 94 has a load sensor 140 and a trip sensor 142 and directional ground fault relay 106 has a load sensor 144 and a trip sensor 146. Additionally, a sensor 148 is coupled to the indicator circuit 108 at the outlet of the lamp 110 and sensors 150 are coupled to the circuit breaker 76 to measure current flowing through the circuit breaker 76.

Each of the plurality of sensors 116-150 is coupled to a controller, such as controller 80 for example, that collects, stores and analyzes data being transmitted by the sensors 116-150. In this embodiment, the controller 80 may be comprised of a number of individual computers that are connected to the sensors 116-150 to provide redundant data collection, storage and analysis.

Figure 7:
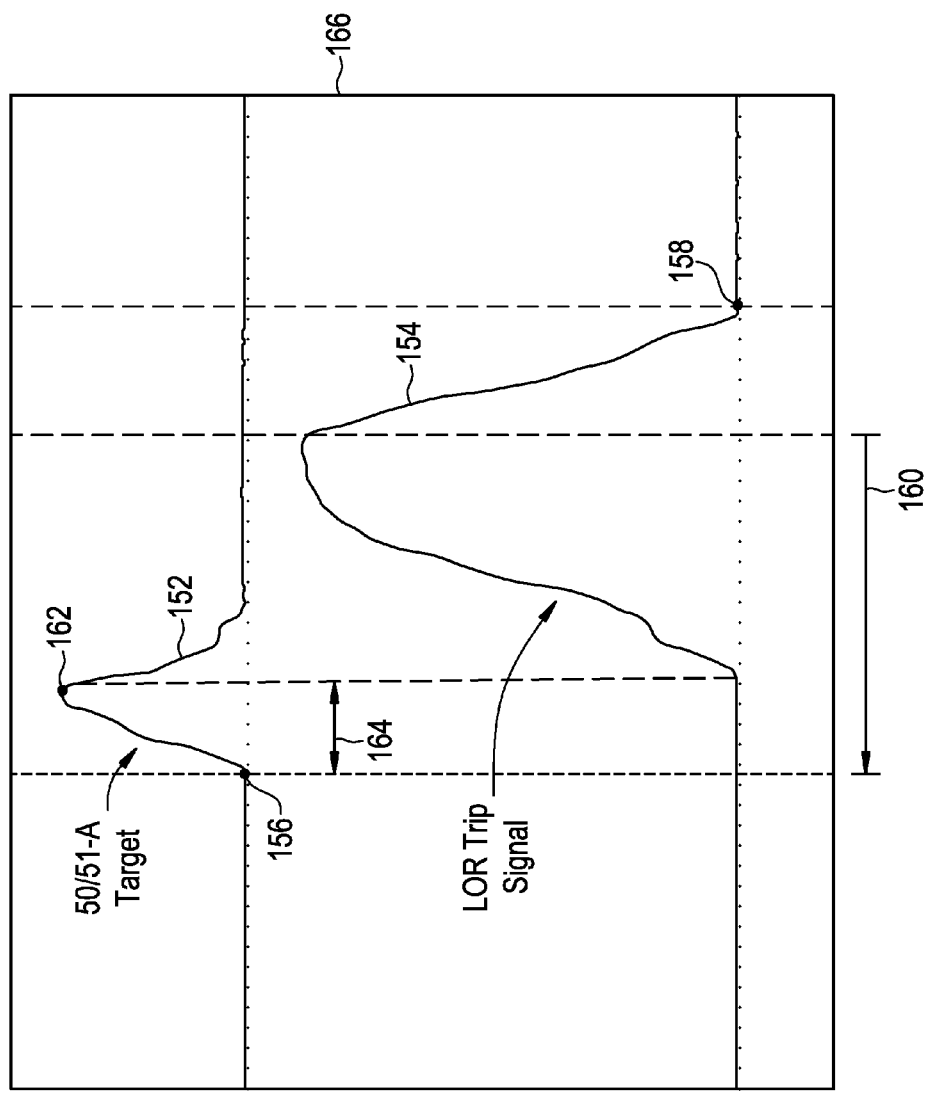
FIG. 7 is a graphical representation of a protective relay and lockout relay output signals in accordance with an exemplary embodiment of the invention.
Figure 8:
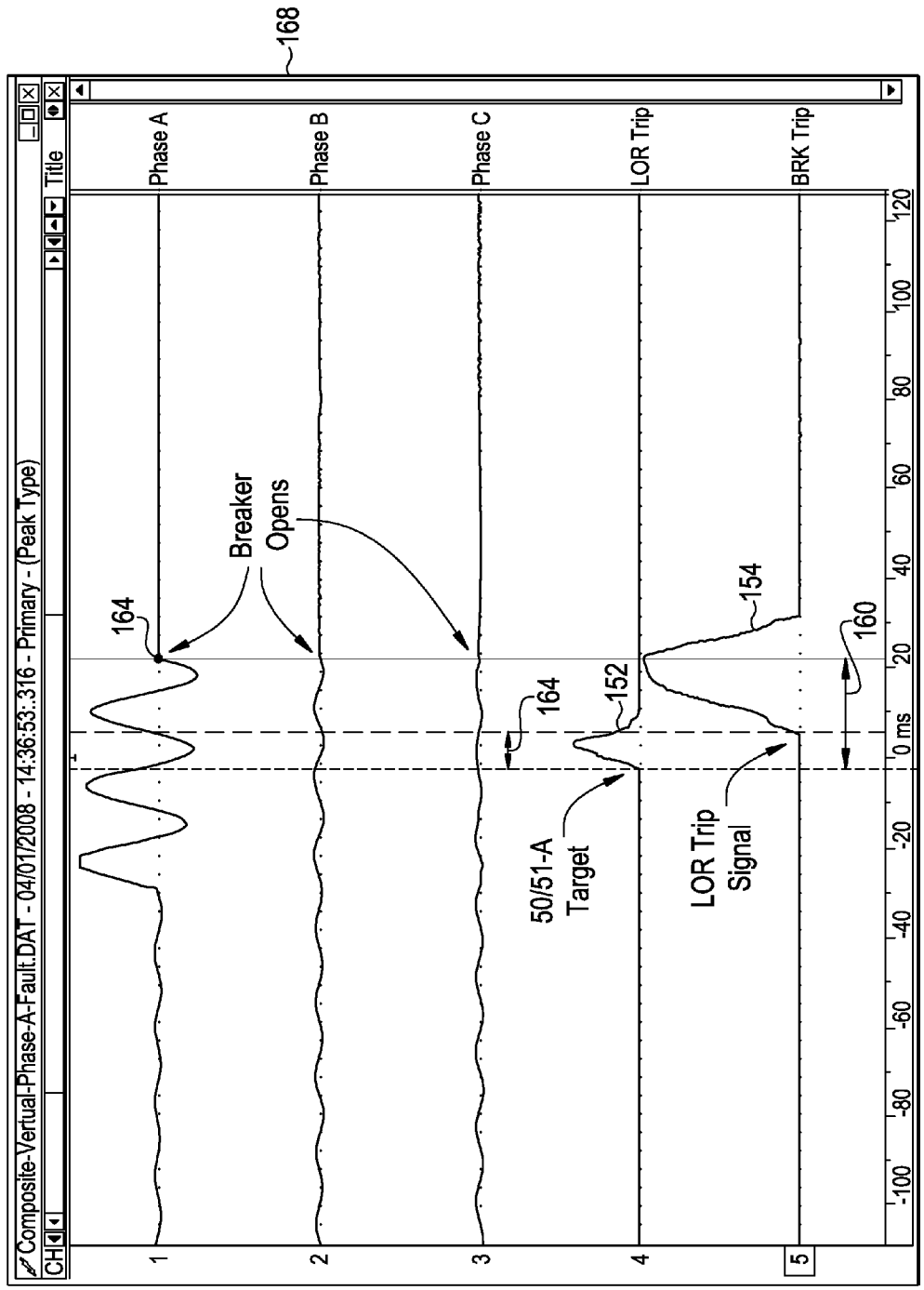
FIG. 8 is another graphical representation of a protective relay, lockout relay and circuit breaker output in accordance with one embodiment of the invention.

During operation, the protective relays 84 continuously monitor the electrical power being delivered from the main transmission network via connection 66 to one or more circuit breakers 76. When a protective relay 84 determines a condition has occurred that is outside a desired parameter, the protective relay transmits a signal to the LOR 115. For example, when time instantaneous relay 98 determines an over-current condition has occurred, a signal 152 is transmitted by the time instantaneous relay 98 to the LOR 115 as is shown in FIG. 7 and FIG. 8. The LOR 115 receives the signal 152 and in response transmits a signal 154 to the circuit breaker 76. The circuit breaker 76 in turn trips or disconnects the connected branch circuit 74, as represented by point 164 in response to receiving the signal 154. The LOR 115 is typically arranged to respond to signal 152 once a peak current level 162 is achieved.

The time 160 from the detection of the undesired condition, indicated by point 156, to the completion of the transmission of the signal 154 to the circuit breaker 76, indicated by point 158, is one factor in determining the effectiveness of the protective relay protection scheme. It should be appreciated that it is desirable to reduce the time 160 to minimize the amount of time the branch circuit 74 is subjected to the undesired condition. It is also desirable to reduce the time 164 it takes for the protective relay 84 to activate the LOR 115. It should further be appreciated that if the signals 152, 154 deteriorate or are corrupted, this may result in a longer activation time 160. If the signal 152 from the protective relay deteriorates or is corrupted too much, the circuit breaker may not trip or open and equipment damage and loss of electrical service may result.

While data and reports 58, 67 provided by existing protective relays are suitable for their intended purposes, they lack sufficient detail to provide operators with an indication on the quality or "health" of the protective relay 84 signaling circuits. At best, the prior art data and reports 58, 67 provide an over all length of time the protective relays are in different operational states with no means for determining whether the protective scheme operated efficiently or whether there were undesirable delays.

In the exemplary embodiment, the controller 78 acquires and stores the data collected by sensors 116-146. The acquired data may then be displayed in a computer display window, such as windows 166, 168, 170 shown in FIGS. 7-9. The windows 166, 168, 170 may be viewable on a computer display (not shown) coupled to controller 78, or on a remote controller 86. The windows 166, 168, 170 may also be transferred from the controller 80, 86 by the operator for offline display and analysis. As will be discussed in more detail below, the data displayed in windows 166, 168, 170 provides the operator with more information than the prior art reports 58, 67 and allows for diagnostics of the protective relay protection scheme.

Figure 9:
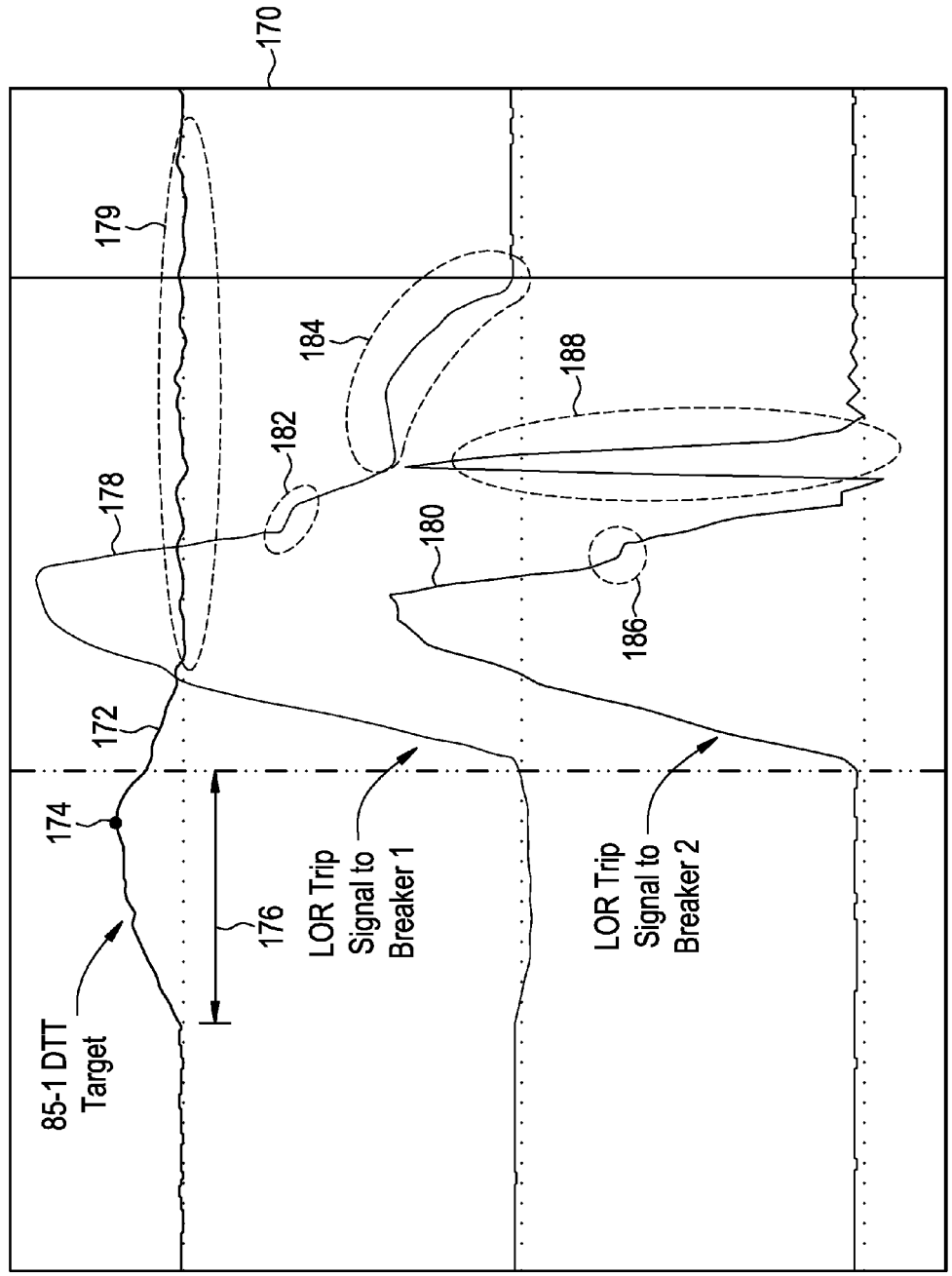
FIG. 9 is another graphical representation of a protective relay and lockout relay output signals in accordance with one embodiment of the invention.

Turning now to FIGS. 7-9, the data collected by the controller 78 will be described. When the protective relay protection scheme is operating as desired, the protective relay 84 transmits a signal 152 that is received by the LOR 115 which in turn activates the circuit breaker 76 interrupting the electrical power to the branch circuits 74. FIG. 7 and FIG. 8 illustrate a properly functioning system where the protective relay signal 152 proceeds rapidly and smoothly to the peak current 162 to activate the LOR 115. Similarly, the LOR signal 154 proceeds rapidly and smoothly to a peak current. Neither signal 152, 154 has any significant distortion that adversely impacts the amount of time it takes to activate the circuit breaker 76. It should be appreciated that in an ideal application, the signals 152, 154 would be a perfect waveform, such as a saw-tooth or square waveform for example. However, such ideal waveforms are not typically achievable when the protective relays 84 are installed in the field and a limited amount of distortion is expected.

A number of situations may arise that result in a distortion of the signals transmitted by the protective relays 84 and the LOR 115. For example, the protective relay cabinet 48 has many wires 56 that overlap, cross and are generally intertwined as they traverse the cabinet 48. One of the wires 56 may impact the signal quality of one or more other wires 56. If one wire has a fault such as poor insulation, a loose connection, arcs or shorts for example, the waveform of signals on surrounding wires 56 may be distorted. It has been determined that these distortions provide a signature that is particular to a type of fault.

Turning now to FIG. 9, window 170 illustrates signal waveforms having undesired distortions. In this example, the protective relay transmits a signal 172. A comparison of the signal 172 and the signal 152 shows that the signal 172 has a relatively smaller slope as the signal ramps to a peak current level 174. The signal 172 also has an irregular pattern 179 where there should be zero current indicating noise or interference on the conductor or wire that carries the signal 172. As will be discussed in more detail below, in one embodiment, the system analyzes the signal 172 for a signature and initiates an alarm or a report if the signature is found. In another embodiment, the system stores the signal 172 each time the protective relay has been activated and initiates an alarm or a report if the signature changes over time in a trend towards an undesired waveform or signature.

The signal waveforms may have other signatures of faults in the protective relay protection scheme as well. In the embodiment of FIG. 9, the protective relay signal 172 activates the LOR 115 which transmits a first signal 178 to a first circuit breaker 76. In addition, the LOR 115 transmits a second signal 180 to a second circuit breaker 76. The first signal 178 has a first fault signature 182 and a second fault signature 184. These fault signatures 182, 184 provide an indication of a fault in the protective relay protection scheme. For example, the signature 184 shows an elongated and elevated current level, which indicates stray current is leaking onto the wire carrying signal 184. Similarly, the second signal 180 has a third signature 186 and a fourth signature 188, which represent a deviation in the expected waveform.

In the exemplary embodiment, the controller 78 may include a database of signatures, such as signatures 182, 184, 186, 188 that associates the signature with a corresponding fault. In another embodiment, the controller 78 may automatically analyze the signatures 182, 184 and corresponding signatures from signals generated by other sensors in the cabinet 48 to identify behavioral patterns that allow the controller 78 to identify or propose which of the many wires 56 in the cabinet 48 may be impacting the performance of the system. It should also be appreciated that the database of signatures may also be included on controller 86.

Figure 10:
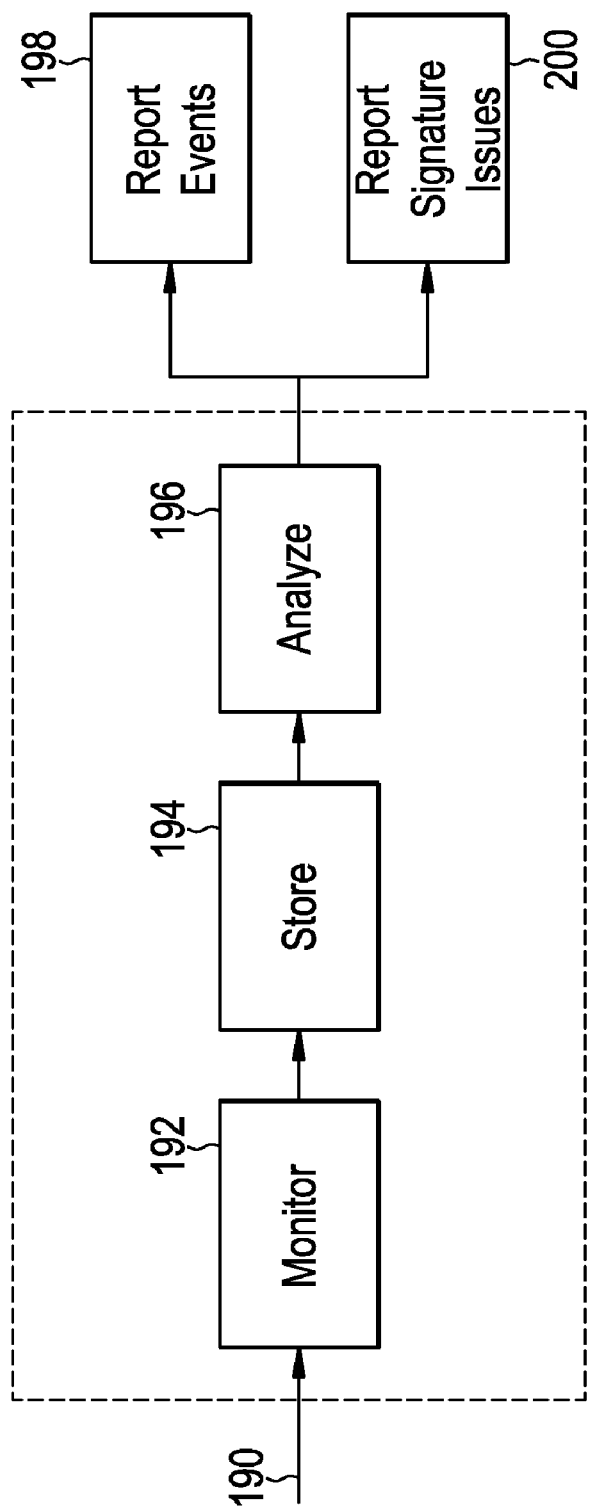
FIG. 10 is a schematic block diagram illustration of a process for assessing a protective relay system in accordance with one embodiment of the invention.

Referring now to FIG. 10, a process for assessing electrical protective circuits, such as those using protective relays for example, will be described. In the exemplary embodiment, the data 190 is transmitted over communications medium 82 to controller 78. The data 190 may include but is not limited to current, voltage, real power, reactive power, sensor identification, measurement date, and measurement time for example. In one embodiment, the data 190 is transmitted in discrete data packets. The data 190 is received by controller 80 which continuously monitors 192 the flow of data. In one embodiment, the data from a global positioning system (not shown) provides a means for aligning data received from multiple sensors to a common time base. The data is then stored 194 and analyzed 196 in real time for anomalies or deviations from an expected condition. The analyzed data then could be used for a number of different purposes, such as for identifying and reporting 198 an activated relay or for reporting 200 the presence of a known or unknown signature in the signal waveform such as first signature 182 or second signature 184 for example.

Figure 11:
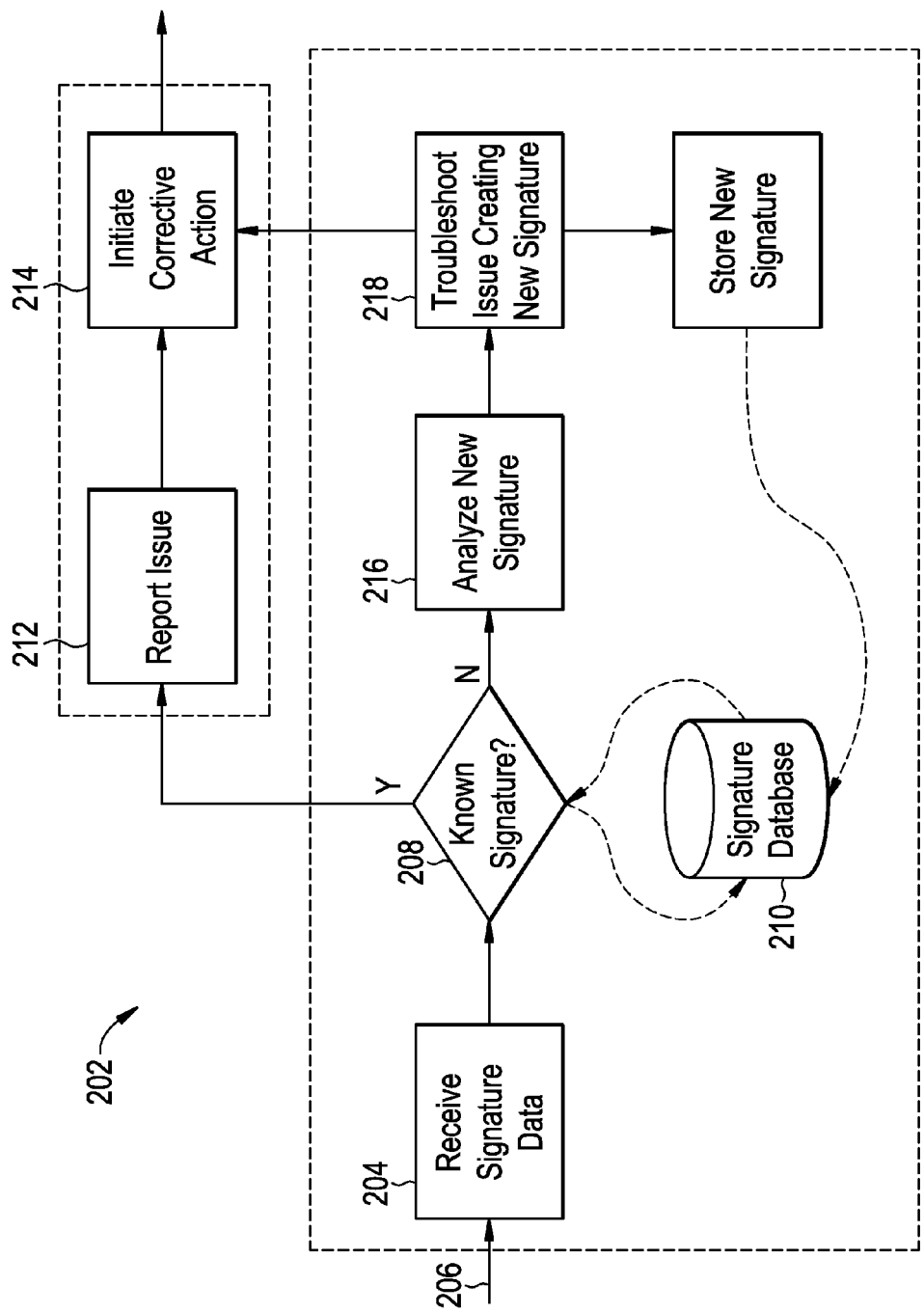
FIG. 11 is another schematic block diagram illustration of a process of assessing a protective relay system in accordance with one embodiment of the invention; and, FIG. 12 is a flow diagram illustration of another method of assessing a protective relay system.

Another process 202 for analyzing electrical protective circuits is shown in FIG. 11. In this embodiment, the process 202 begins by receiving data 206 in block 204. Data 206 may be received from an upstream process, such as report signature block 200 (FIG. 10) or be captured and manually transferred by an operator for example. The process 202 then proceeds to query block 208 where it is determined if the signatures, such as first signature 182 or second signature 184 for example, in the data 206 are known signatures. In the exemplary embodiment, a database 210 of signatures is used to compare the acquired signature in data 206 to signatures which are known. If query block 202 returns a positive, meaning the signatures in data 206 are known, the process 202 proceeds to block 212 where the issue corresponding to the identified signature is reported and corrective action is initiated in block 214.

If the query block 208 returns a negative, meaning the data 206 contains a signature not contained in the database 210, the process 202 proceeds to block 216 where the new signature is analyzed. The analysis of the new signature may include, but is not limited, isolating the new signature from a normal or expected signature or categorizing the new signature through comparison with known signatures for example. Once the new signature is analyzed, the process 202 proceeds to block 218 where the issue that has created the new signature is examined by troubleshooting the electrical protective circuit. The output of block 218 is an identification of the issue that is causing the new signature. After block 218, the process 202 bifurcates and with one portion of the process proceeding to block 214 where corrective action is taken. The second portion of the process 202 proceeds to block 220 where the new signature is stored.

Figure 12:
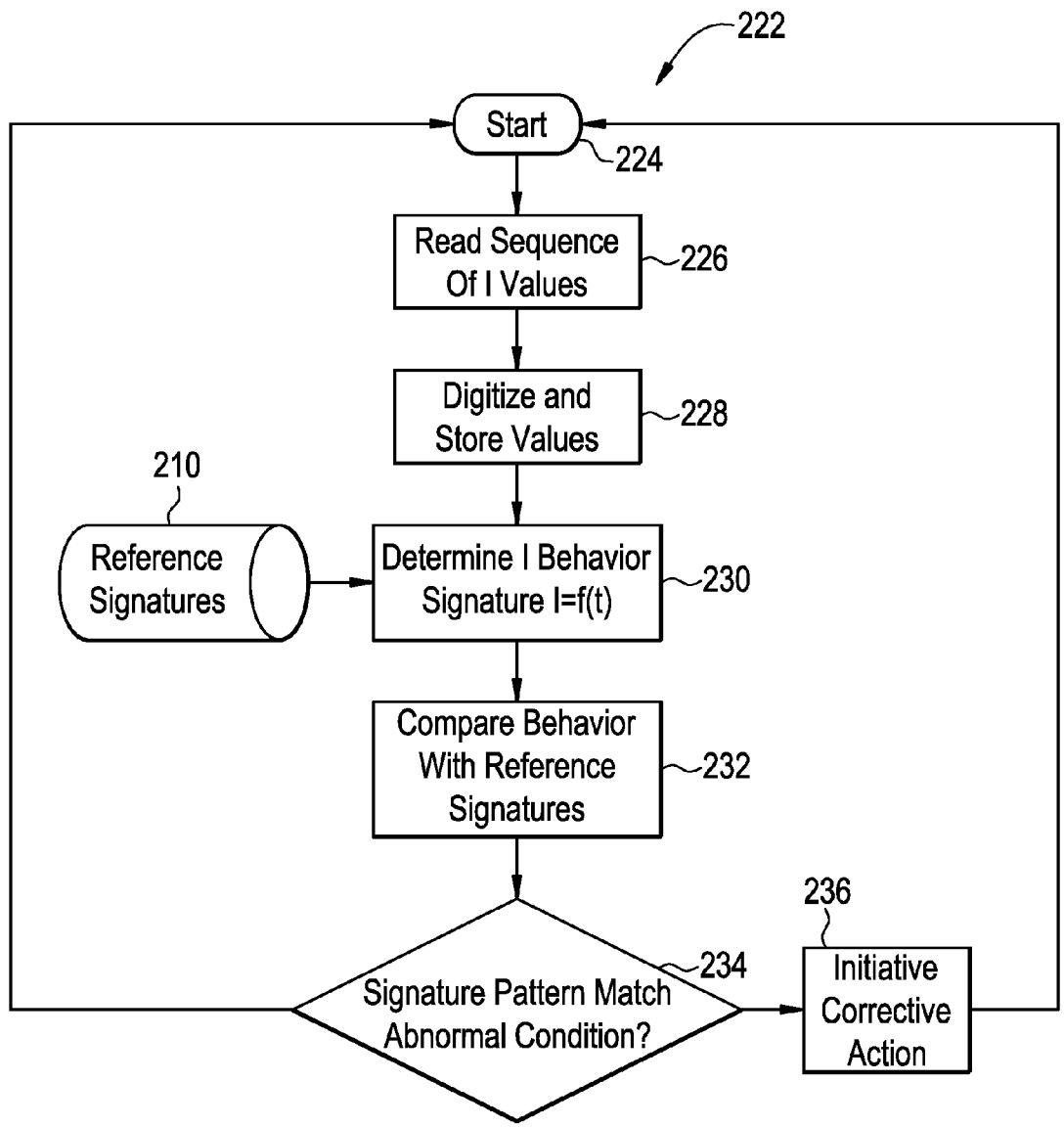

A method 222 of determining a signature is illustrated in FIG. 12. The method 222 begins in start block 224 and proceeds to block 226 where the current values from relay sensors 116-146 for example, are acquired, such as by controller 78 for example. The current values are converted into a digital form and stored in block 228, such as in memory for example. The method 222 determines behavior patterns of the current over a predetermined increment of time in block 230. These behavior patterns are then compared to the reference signatures stored in database 210 in block 232. If a behavior pattern and an abnormal or undesired reference signature substantially match, query block 234 returns a positive and the method 222 proceeds to block 236 where corrective action is taken. If the query block 234 returns a negative, meaning there is no match, then the method 222 loops back to start block 224. Where the method 222 is implemented on a processor, the method 222 periodically repeats the process according to a predetermined rhythm or pattern. That is to say, every so many milliseconds, all of the steps shown in FIG. 12 are repeated.

Pattern recognition programs are known in the art and have been used for numerous applications such as to (1) identify sea creatures from their acoustic patterns, (2) identify body hormonal changes from sensor measurements, (3) identify the fracture point in a tool using vibration patterns, (4) identify land vehicles from their acoustic and seismic signatures, (5) identify wear patterns in materials from thickness measurements, (6) identify intruders in secure areas using microwave and IR measurements (7) identify automotive intrusion from shock and acoustic patterns, and (8) identify faulty power-seat assemblies from acoustic patterns, inter alias. In one embodiment of the pattern recognition method for monitoring sensor signals of the present invention is essentially analog pattern recognition software which, based on current and voltage measurements taken periodically over specified time intervals, is capable of creating voltage and current behavior patterns that can be compared to reference current and voltage signatures within a defined tolerance range. From such comparisons, the signatures within the sensor signal may be determined, and issues related to the electrical protective circuit may be ascertained. Exemplary pattern recognition software is available, such as the Pattern Interpretation and Recognition Application Toolkit Environment (PIRATE) developed by the United States National Aeronautics and Space Administration at the Johnson Space Center. PIRATE is a block-oriented software system that aids the development of application programs that analyze signals in real time in order to recognize signal patterns that are indicative of conditions or events of interest. PIRATE contains several predefined modules, including ones for data communication, signal processing, and data filtering. Among these are modules to filter out the highly non-Gaussian errors that are typical of the communication process while leaving the nonerroneous data intact. Also among the predefined modules are a Bayesian classifier and other modules for interpreting the contents of signals. During execution of the pattern recognition application program, the source module of the program acquires the incoming data, such as data 190, 206 for example, and provides the data to downstream modules.

It should be appreciated that in one embodiment, the controller 78, 86 may also be described in terms of a finite state machine that executes the methods and processes described herein, such as those illustrated in FIGS. 10-12 for example. Finite state machines, commonly referred to as state machines, are widely used in user designs for a variety of purposes, including controlling sequences of actions. A state machine is a model of behavior comprising states and transitions. A state represents the sequence of inputs to the state machine from its start to the present moment. A transition specifies a change in state from the current state, often, though not necessarily, as a result of one or more inputs received. In hardware, state machines are typically implemented as registers to store state variables and combinatorial logic gates to implement transitions and state machine outputs.

An embodiment of the invention may be embodied in the form of computer-implemented processes and apparatuses for practicing those processes. The present invention may also be embodied in the form of a computer program product having computer program code containing instructions embodied in tangible media, such as floppy diskettes, CD-ROMs, hard drives, USB (universal serial bus) drives, or any other computer readable storage medium, such as random access memory (RAM), read only memory (ROM), or erasable programmable read only memory (EPROM), for example, wherein, when the computer program code is loaded into and executed by a computer, the computer, as part of a programmable controller, becomes an apparatus for practicing the invention. Execution of the method includes interaction between the controller and the medium voltage switches installed on the feeders to verify the status of the switches, prior and after the commands are issued for their operation. The present invention may also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to manage the collection and presentation of data recorded at an electrical substation and the assessment of electrical protective circuits.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of monitoring a protective relay system comprising:
    sensing a first signal current flowing from a protective relay;
    storing said first signal current;
    identifying a first signature portion of said first signal current;
    comparing said first signature portion against a reference signature; and,
    identifying an undesired operating condition from said first signature portion;
    wherein said reference signature is a database including a plurality of reference signatures, wherein each of said plurality of reference signatures is associated with a different undesired operating condition;
    wherein sensing a second signal current flowing from said protective relay;
    storing said second signal current;
    identifying a second signature portion of said second signal current;
    comparing said second signature portion against said first signature portion comparing said second signature portion against said database of reference signatures; and,
    determining a change in a behavior pattern of said first signature portion and said second signature portion;
    comparing said change in behavior pattern to said database of reference signatures, and initiating corrective action when said change in behavior pattern indicates an undesired operating condition.

2. The method of claim 1 wherein said plurality of reference signatures includes a first reference signature representing a shorted signal wire.

3. The method of claim 2 wherein said plurality of reference signatures includes a second reference signature representing a crossover current.

4. The method of claim 1 wherein said sensing of said first signal current includes measuring a peak current.

5. The method of claim 4 further comprising initiating an alarm if said peak current is below a threshold current.

6. The method of claim 1 wherein said first signature portion includes a second signature portion and a third signature portion.

7. The method of claim 6 further comprising:
    comparing said second signature portion against said database of reference signatures;
    comparing said third signature portion against said database of reference signatures; and,
    identifying an undesired operating condition from said second signature portion.

8. A protective relay system coupled to an electrical distribution device comprising:
    at least one protective relay coupled to communicate a first signal to said electrical distribution device in response to a first event;
    a sensor coupled to said at least one protective relay to sense said first signal, said sensor transmitting a second signal indicative of said first signal current in response to sensing said first signal; and,
    a controller electrically coupled to said sensor to receive said second signal, said controller having a processor responsive to executable computer instructions when executed on said processor for comparing said second signal to a database of reference signals and initiating a first alarm when said second signal substantially matches a signature in said database of reference signals;
    wherein said processor is further responsive to executable computer instructions when executed on said processor for analyzing said second signal when said second signal does not substantially match a signature in said database of reference signals;

wherein said processor is further responsive to executable computer instructions when executed on said processor for determining a peak current level of said first signal current and initiating a second alarm when said peak current level is less then a threshold;

wherein said at least one protective relay communicates a third signal in response to a second event;

said sensor transmits a fourth signal in response to sensing said third signal; and said processor is further responsive to executable computer instructions when executed on said processor for determining a change in behavior pattern in said second signal and said fourth signal and comparing said change in behavior pattern to said database of reference signatures, said processor further initiating an alarm when said change in behavior pattern indicates an undesired operating condition.

9. The protective relay system of claim 8 wherein said processor is further responsive to executable computer instructions when executed on said processor for determining a first signature portion and a second signature portion of said second signal and for comparing said first signature portion and said second signature portion to said database of reference signals.

10. The protective relay system of claim 9 wherein said processor is further responsive to executable computer instructions when executed on said processor for initiating an alarm when either said first signature portion or said second signature portion substantially matches a signature in said database of reference signals.

* * * * *